United States Patent [19]

Macemon et al.

[11] 4,016,491
[45] Apr. 5, 1977

[54] SINGLE KNOB ROTARY CONTROL OF METER DAMPING AND PUSH CONTROL OF DAMPING OVERRIDE

[75] Inventors: James H. Macemon, Glen Burnie; Charles I. Soodak, Silver Spring, both of Md.

[73] Assignee: Baxter Travenol Laboratories, Inc., Deerfield, Ill.

[22] Filed: Apr. 22, 1976

[21] Appl. No.: 679,443

[52] U.S. Cl. ............................ 324/128; 324/125
[51] Int. Cl.² .................... G01R 1/38; G01R 1/02
[58] Field of Search ............ 324/125, 128, 115; 73/431; 356/96

[56] References Cited
UNITED STATES PATENTS

| 3,412,328 | 11/1968 | Lowery | 324/125 |
| 3,863,152 | 1/1975 | Wernitz | 324/128 |

Primary Examiner—Rudolph V. Rolinec
Assistant Examiner—Ernest F. Karlsen
Attorney, Agent, or Firm—Karl Saalbach; Richard G. Kinney; Henry W. Collins

[57] ABSTRACT

The noisy amplified signal from a photoelectric device is passed through an electronic low-pass filter before having its direct current component read on a meter. The cut-off frequency of the low-pass filter is adjusted in known manner by rotation of a control knob, so as to suitably match the cut-off frequency to the noisiness of the signal with a view towards speeding up the stabilization of the meter reading. To overcome the sluggishness of the system, the same control knob is briefly pushed, thereby overriding the low pass control. The method of using the system to speed up meter reading is described.

10 Claims, 7 Drawing Figures

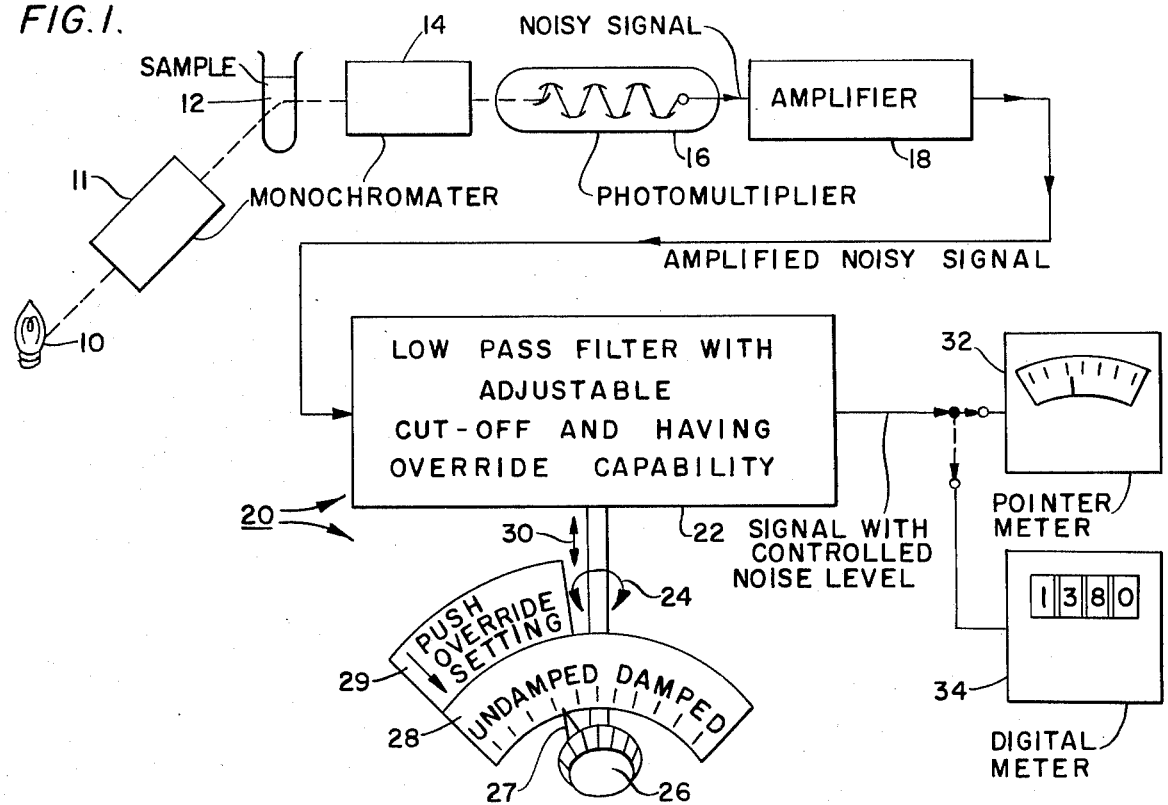
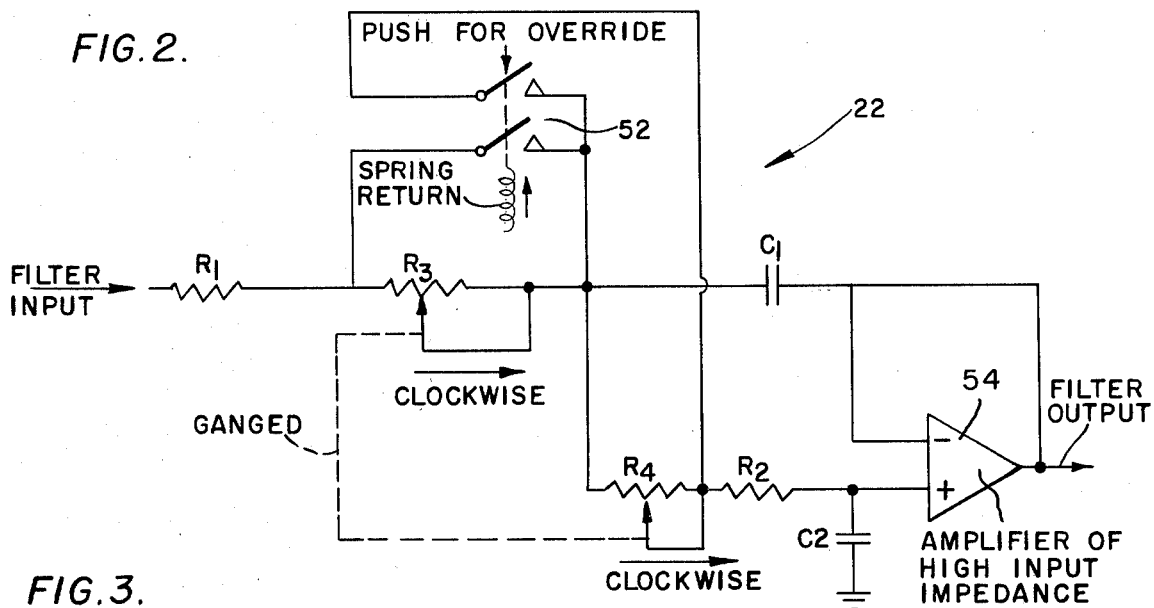
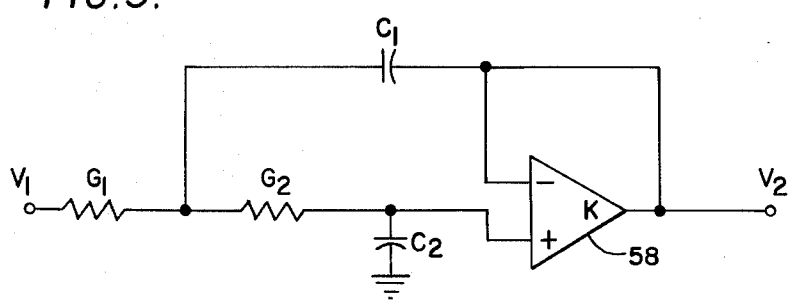

FIG. 4.
$$w_0 = \sqrt{\cfrac{1}{(R_1+R_3)(R_2+R_4)C_1 C_2}} = \text{CUT-OFF FREQUENCY IN RADIANS PER SECOND}$$
FIG. 5.
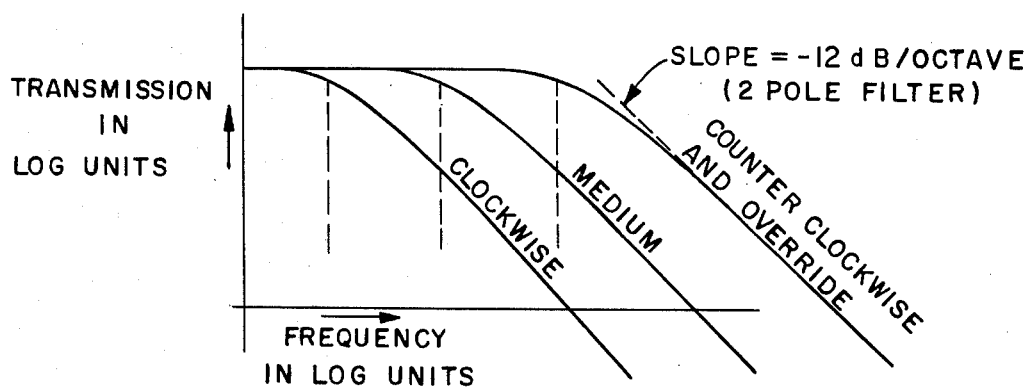
FIG. 6.
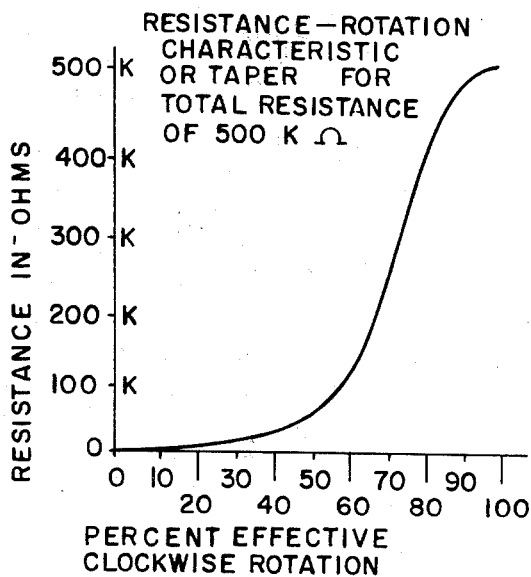
FIG. 7.
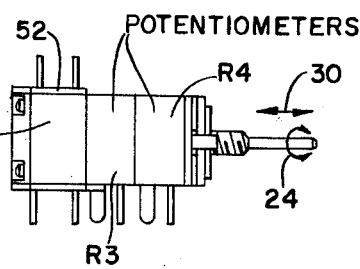

SINGLE KNOB ROTARY CONTROL OF METER DAMPING AND PUSH CONTROL OF DAMPING OVERRIDE

CROSS REFERENCE TO RELATED APPLICATIONS

The meter control system disclosed herein is of general utility. It is part of a newly developed spectrofluorometer having other inventive features which are unrelated to the instant invention, except for use in the same commercial embodiment. The unrelated inventions are disclosed in the following applications.

SUMMARY OF THE INVENTION

When measuring the average value of low levels of light with a photomultiplier, it is found that the photomultiplier signal, after being amplified, is very noisy, and causes the meter needle, by which the average value of the signal is read, to fluctuate. This fluctuation is caused by the nature of the amplified photomultiplier signal, which has a significant direct current component, and also has a fluctuating noisy non-significant alternating current component. Accordingly, the needle of the meter will fluctuate even if the meter movement itself is properly damped.

It is known in the prior art to insert an adjustable low pass filter into the signal line ahead of the meter in order to partially suppress the alternating current component of a noisy signal. For a quiet signal, the cut-off frequency can be adjusted to be high, producing little damping of the meter reading, while for a noisy signal the cut-off frequency can be adjusted to be low, producing great damping of the meter reading. Thus, the tendency of the meter needle to fluctuate can be controlled. However, when using sufficient damping to control fluctuation, it is found that the meter becomes sluggish in its response and the operator, who is no longer uncertain of the reading because the fluctuations have been overcome must nonetheless wait some time before taking a reading, while the meter needle slowly approaches its final reading.

It is also known in the prior art for the operator to set the cut-off frequency control to a proper setting, and, if the needle is obviously homing in to a final position which is far off from the present position, to speed up the homing-in process by momentarily increasing the cut-off frequency before restoring it to its previous value, thereby causing the needle to momentarily move rapidly and then resume its homing-in from a fresh starting position. When this is done, it is possible that the fresh starting position will be nearer to the final position, in which case the total time elapsed before a stable meter reading is achieved is materially reduced. If the fresh starting position is worse, then another attempt to speed up the homing-in process can be made.

The instant invention permits the meter reading to be taken more quickly by providing the low pass filter adjusting knob with two motions. A rotary motion of the knob in the clockwise direction decreases the cut-off frequency, thereby increasing meter damping and, necessarily, meter sluggishness. A push motion of the same control knob overrides the rotary control and increases the cut-off frequency to the maximum available in the low-pass filter, thereby causing the needle to fluctuate. Thus, the rotary control knob is also a push button, and the same knob can be used, on the one hand, to control the fluctuation of the meter needle, and on the other hand, to obviate some of the wait needed for the sluggish needle to home in to its final position.

An example will make this clearer.

Suppose that the steady state reading would be 8.0, but that there is ± 10% noise on the signal, so that the meter reading fluctuates between 7.2 and 8.8 if minimum damping is used, and homes in rather sluggishly to a value of 8.0 if maximum damping is used.

If maximum damping is in use, and the meter needle reads 7.2, it will home in towards 8.0 and attain a value within 99% of 8.0 (or 7.92) in about six seconds. But the operator need not wait the whole 6 seconds for the needle to stabilize its position. Instead, the operator pushes the control know, thereby reducing the damping to minimum, observes the fluctuating needle, and releases the control knob when the needle is fluctuating around somewhere near the portion of the scale at which the operator expects the needle to finally stabilize, based on the operator's observation of the previously slow drift of the needle.

Thus, by pushing the control knob, the operator can speed up the process of reading the meter.

The speeding up of the reading of the meter is even more pronounced when the initial meter reading is zero. If the maximum damping is in use, and the meter initially starts at zero, it will take say, for a particular circuit, 6 seconds to attain 90% of the final indication of 8.0. If the control knob is pushed and released, the meter will then read somewhere between 7.2 and 8.8. Thus, by merely pushing the control knob, 6 seconds of time have been saved.

In the event a digital meter, rather than a pointer type meter, is used, the digital jumping of the indication has a tendency to cause the observer to delay taking a reading. Thus, it is important, when using digital meters, to cause the digital meter to home in to its final reading quickly.

VIEWS OF DRAWING

FIG. 1 is a diagram showing the relationship between various parts of a spectrophotometer system which includes the inventive adjustable meter damping control;

FIG. 2 shows the circuit diagram for the adjustable active low pass filter used in the system of FIG. 1;

FIG. 3 is a simplified version of a low pass active filter used in the instant invention;

FIG. 4 is a mathematical formula and FIG. 5 is a graph, each of which characterize the circuit of FIG. 2;

FIG. 6 displays a characteristic of resistors $R_3$ and $R_4$ of FIG. 2; and

FIG. 7 shows the physical set-up by which resistors $R_3$ and $R_4$ are ganged and united with switch 52.

DETAILED DESCRIPTION

Use of the invention is especially convenient in fluorescence work where very low light levels, leading to noisy photomultiplier tube signals, are frequently encountered. Such a system is disclosed in FIG. 1.

A light source 10, typically an ultraviolet source, is filtered by an excitation monochrometer 11 and excites a sample 12. The sample fluoresces, and the light emitted is filtered by emission monochrometer 14 and falls on photomultiplier 16. The light lever at the photomultiplier is exceedingly low, being near starlight in intensity, and the output of the photomultiplier 16, after being amplified in amplifier 18, is noisy.

The noisy signal is applied to the signal damping control 20, which comprises a low pass filter 22 having an adjustable cut-off controlled by rotary motion of control knob 26. The control knob 26 carries a pointer 27, sweeping over the damping scale 28. The control knob 26 can also be pushed towards the panel housing of low pass filter 22 to move rectilinearly along the direction 30, there being a spring return to restore the knob 26 to its initial position when the push ceases. When the control knob 26 is pushed in, the cut-off frequency is thereby adjusted to be the maximum possible with low pass filter 22, corresponding to extreme counterclockwise rotation of pointer 27 over scale 28. An override indicia 29 is provided to indicate this.

The signal output of low pass filter 22 is displayed on either a pointer type meter 32 or a digital type meter 34.

The circuit inside low pass filter 22 is shown in FIG. 2. Except for the presence of by-passing shunt connector 52, this circuit will be recognized by those skilled in the art as the conventional active two-pole low pass filter of FIG. 3, in which 100% negative feedback turns the amplifier 58 into a unity gain voltage follower having a K of one. The circuitry of low pass filter 22 illustrated in FIGS. 2 and 3 is extremely stable because of the 100% negative feedback. The device 54 is an operational amplifier with an exceedingly high input impedance, so that it does not load the RC circuit.

When control knob 26 is pushed, the bypassing shunt connector 52 shorts out the resistors $R_3$ and $R_4$. This has the same effect as though the conrol knob 26 were rotated to the extreme left. The result is indicated by the override indicia 29.

The construction of the variable resistors $R_3$ and $R_4$ and the bypassing shunt connector 52 is conventional, and is illustrated in FIG. 7. The assembly is made of a number of readily available standard parts.

The taper of the resistors $R_3$ and $R_4$ is preferably as shown in FIG. 6, although not necessarily so. The illustrated taper is known in the industry as an A or volume control taper, lying between the characteristics of a sine-wave taper and a decibel taper. The use of an A taper is desirable because it causes the cut-off frequency to shift approximately as rapidly, with turn of control knob 26, at both ends of the scale 28.

The cut-off frequency is determined for the circuit of FIG. 2 by the formula set forth in FIG. 5.

The transmission characteristics of the circuit of FIG. 2 are disclosed in FIG. 5, for three different settings of control knob 26. It will be noted that the right-most curve represents the characteristics at both the extreme left rotation and at the pushed condition of the control knob 26.

It will be appreciated by a person skilled in the art, that during any one experimental set up, the amount of noise in the signal will be relatively constant. As conditions are changed, each run of the apparatus may have a different amount of noise, since the sample may be different, or a different frequency may be under study, etc. Accordingly, the cut-off frequency may be under study, etc. Accordingly, the cut-off frequency of signal damping control 20 is preferably adjusted, whenever conditions change, but may not need changing during a series of runs that are nearly identical. However, the pass override feature is useful for speeding up the readings even when conditions are almost identical.

We claim:
1. In combination:
   a source of noisy signal having a significant direct current component and a non-significant alternating current component;
   said alternating current component having frequencies and amplitudes which, over a small period of time, are relatively constant, but which will greatly vary at different times;
   adjustable means for removing a selected portion of said alternating current components from said noisy signal to produce a smoothed signal having all of the significant direct current component and a lesser amount of said non-significant alternating component than said noisy signal;
   means to display the value of said smoothed signal;
   said adjustable means including a manual control having dual motions;
   means under the control of one of said dual motions to variably control the amount of alternating current components removed by said adjustable means in accordance with the amount of said one motion;
   means under the control of the other of said dual motions to override the means under the control of one of said dual motions and to control said adjustable means for removing to remove a predetermined amount of said alternating current components.
2. Subject matter under claim 1 in which
   said adjustable means for removing is a low pass filter having an adjustable cut-off; and
   one of said dual motions controls said adjustable cut-off.
3. Subject matter under claim 2 in which said filter is an active filter.
4. Subject matter under claim 3 in which said one of said dual motions is rotary motion.
5. Subject matter under claim 3 in which said one of said dual motions is push motion.
6. Subject matter under claim 5 in which said source of noisy signals is a photomultiplier.
7. Subject matter under claim 6 in which said multiplier receives the output beam from a sample in a spectrophotometer.
8. Subject matter under claim 7 in which the spectrophotometer is a spectrofluorometer.
9. Subject matter under claim 8 in which said predetermined amount is an amount within the minimum range of adjustment of said adjustable means for removing.
10. Subject matter under claim 1 in which said predetermined amount is an amount within the minimum range of adjustment of said adjustable means for removing.

* * * * *